(12) United States Patent
Ishikawa et al.

(10) Patent No.: US 9,819,370 B2
(45) Date of Patent: Nov. 14, 2017

(54) DISTORTION COMPENSATION DEVICE AND DISTORTION COMPENSATION METHOD

(71) Applicant: FUJITSU LIMITED, Kawasaki-shi, Kanagawa (JP)

(72) Inventors: Hiroyoshi Ishikawa, Kawasaki (JP); Tomoya Ota, Kawasaki (JP); Kazuo Nagatani, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 63 days.

(21) Appl. No.: 14/945,801

(22) Filed: Nov. 19, 2015

(65) Prior Publication Data
US 2016/0173147 A1 Jun. 16, 2016

(30) Foreign Application Priority Data

Dec. 10, 2014 (JP) .................................. 2014-250353

(51) Int. Cl.
*H04B 1/04* (2006.01)

(52) U.S. Cl.
CPC ... *H04B 1/0475* (2013.01); *H04B 2001/0425* (2013.01)

(58) Field of Classification Search
CPC ... G06F 11/07; H03F 1/26; H03F 1/30; H03F 1/32; H03F 1/3247; H04B 1/04; H04B 1/0475; H04B 1/10; H04B 15/00; H04K 1/02; H04L 25/03; H04L 25/49
USPC .............. 330/149; 375/295–297; 455/63, 69, 455/114.2, 114.3, 522; 714/700
See application file for complete search history.

(56) References Cited

U.S. PATENT DOCUMENTS

| 2001/0007435 A1* | 7/2001 | Ode ..................... H03F 1/3247 330/149 |
| 2005/0047521 A1* | 3/2005 | Ishikawa ............... H03F 1/3247 375/296 |
| 2006/0209983 A1 | 9/2006 | Shako et al. |
| 2007/0229180 A1* | 10/2007 | Shimizu ............... H03F 1/3282 332/103 |
| 2007/0296495 A1 | 12/2007 | Shako et al. |

(Continued)

FOREIGN PATENT DOCUMENTS

| JP | 2003-218970 A | 7/2003 |
| JP | 2006-261969 A | 9/2006 |

(Continued)

*Primary Examiner* — Shawkat M Ali
(74) *Attorney, Agent, or Firm* — Arent Fox LLP

(57) ABSTRACT

A distortion compensation device includes: a storage configured to store a distortion compensation coefficient for compensating a distortion of a transmission signal to be amplified and transmitted, by corresponding to a combination of a plurality of addresses; a first generator configured to generate a first address according to a power or an amplitude of an input signal; a second generator configured to generate a second address according to a first vector to interconnect sample points on an IQ plane where the sample points of the input signal are drawn in time series; and a distortion compensation unit configured to acquire the distortion compensation coefficient corresponding to a combination of the first address and the second address from the storage, and to perform a predistortion processing on the input signal, by using the acquired distortion compensation coefficient, so as to generate the transmission signal.

10 Claims, 14 Drawing Sheets

(56) References Cited

U.S. PATENT DOCUMENTS

| | | | |
|---|---|---|---|
| 2008/0186095 A1* | 8/2008 | Okazaki | H03F 1/3294 |
| | | | 330/149 |
| 2008/0197925 A1* | 8/2008 | Furuta | H03F 1/3247 |
| | | | 330/149 |
| 2009/0227216 A1* | 9/2009 | Lozhkin | H04B 1/0475 |
| | | | 455/114.3 |
| 2010/0194474 A1* | 8/2010 | Ishikawa | H03F 1/3247 |
| | | | 330/149 |
| 2011/0216815 A1* | 9/2011 | Choi | H04B 1/525 |
| | | | 375/219 |
| 2011/0227643 A1 | 9/2011 | Matsubara et al. | |
| 2012/0288030 A1* | 11/2012 | Nagatani | H04B 1/0475 |
| | | | 375/297 |

FOREIGN PATENT DOCUMENTS

| | | |
|---|---|---|
| JP | 2011-199429 A | 10/2011 |
| WO | WO 2006/095422 A1 | 9/2006 |

\* cited by examiner

US 9,819,370 B2

DISTORTION COMPENSATION DEVICE AND DISTORTION COMPENSATION METHOD

CROSS-REFERENCE TO RELATED APPLICATIONS

This application is based upon and claims the benefit of priority from the prior Japanese Patent Application No. 2014-250353 filed on Dec. 10, 2014, the entire contents of which are incorporated herein by reference.

FIELD

The embodiments discussed herein are related to a distortion compensation device and a distortion compensation method.

BACKGROUND

According to a speeding-up of a wireless communication, a high-efficiency transmission by digitization has recently been employed. Under these circumstances, in order to suppress the deterioration of a signal quality, a high linearity in a power amplifier is expected. Also, at the same time, in view of, for example, miniaturization or operating cost reduction of a device, the development of a power amplifier operating at a high power exchange efficiency is being carried out. In general, however, in the power amplifier, linearity and a power exchange rate are in a conflict relationship with each other.

Therefore, in order to achieve both the linearity and the power exchange efficiency, the power amplifier is operated in a non-linear region where the power exchange efficiency is high, and the linearity is maintained using a distortion compensation device that is configured to remove the non-linear distortion occurring at that time. As a distortion compensation system used in the distortion compensation device, there is, for example, a predistortion scheme (hereinafter, referred to as a "PD scheme"). The PD scheme is a technology that increases the linearity at the output of a power amplifier by providing an inverse characteristic of non-linear distortion of the power amplifier to a transmission signal in advance. In a distortion compensation device that employs the PD scheme, for example, a distortion compensation coefficient for performing distortion compensation is stored in a look-up table (LUT), and an address according to the power or the amplitude of an input signal input to a power amplifier is designated so as to read the distortion compensation coefficient from the LUT.

Here, it has been known that a phenomenon called a memory effect occurs in a power amplifier. The memory effect refers to a phenomenon in which an output signal according to an input signal of a power amplifier at a certain time point is influenced by a past input signal. When the memory effect of the power amplifier occurs, there is a concern that a distortion compensation performance may be deteriorated in the distortion compensation device that designates only an address according to the power or the amplitude of the input signal at the present time.

In contrast, there is suggested a technology in which an address according to a phase difference of input signals at different time points (hereinafter, referred to as a "phase difference address") is generated in addition to an address according to a power or an amplitude of a signal at the present time, and an address is designated based on the phase difference address so as to read a distortion compensation coefficient from a LUT.

Related technologies are disclosed in, for example, Japanese Laid-open Patent Publication No. 2011-499429.

SUMMARY

Accordingly to an aspect of the invention, a distortion compensation device includes: a storage configured to store a distortion compensation coefficient for compensating a distortion of a transmission signal to be amplified and transmitted, by corresponding to a combination of a plurality of addresses; a first generator configured to generate a first address according to a power or an amplitude of an input signal; a second generator configured to generate a second address according to a first vector to interconnect sample points on an IQ plane where the sample points of the input signal are drawn in time series; and a distortion compensation unit configured to acquire the distortion compensation coefficient corresponding to a combination of the first address and the second address from the storage, and to perform a predistortion processing on the input signal, by using the acquired distortion compensation coefficient, so as to generate the transmission signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

The technologies in the conventional art have a problem in which, when a change amount of phases of input signals is small, the distortion compensation performance is deteriorated.

Figure 14:
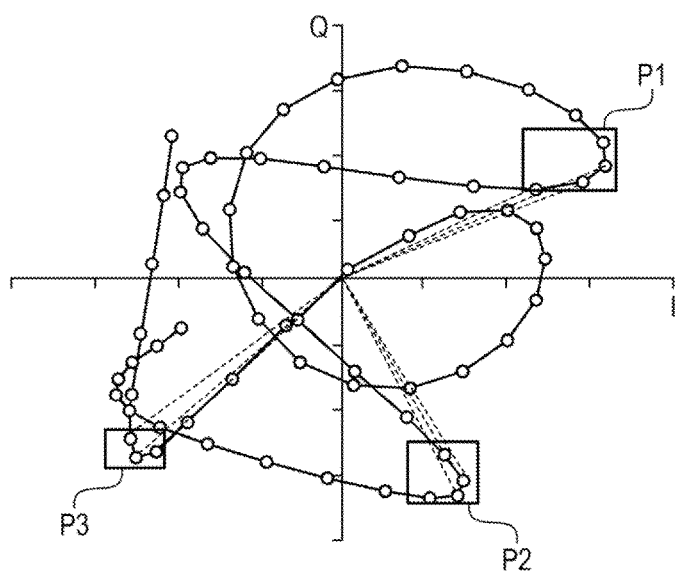
FIG. 14 is a view for explaining problems.

FIG. 14 is a view for explaining the problem. In FIG. 14, an IQ plane is illustrated in which sample points of input signals are drawn in time series. In FIG. 14, a broken line corresponds to a phase of each sample point. Also, an angle between broken lines corresponds to a phase difference between sample points.

As illustrated in FIG. 14, when a change amount of phases of input signals is decreased, a phase difference between sample points corresponding to different time points approaches zero. For example, in the example of FIG. 14, when attention is paid to parts P1 to P3 enclosed by rectangular frames, as the change amount of phases of input signals is decreased, a phase difference between sample points corresponding to different time points approaches zero. Here, a phase difference address is generated according to a phase difference of input signals at different time points, and a distortion compensation coefficient is read from an LUT using the phase difference address. The resolution of the phase difference address is deteriorated as the phase difference between sample points corresponding to different time points approaches zero. Accordingly, there is possibility that an optimum address for reading a distortion compensation coefficient from the LUT may not be designated by the phase difference address. As a result, there is a concern that the distortion compensation performance may be deteriorated.

Hereinafter, detailed descriptions will be made on exemplary embodiments of a distortion compensation device and a distortion compensation method in which a deterioration of a distortion compensation performance may be improved even when a change amount of phases of input signals is small, with reference to drawings. Also, the distortion compensation device and the distortion compensation method according to the present disclosure are not limited by the embodiments as below.

First Embodiment

Figure 1:
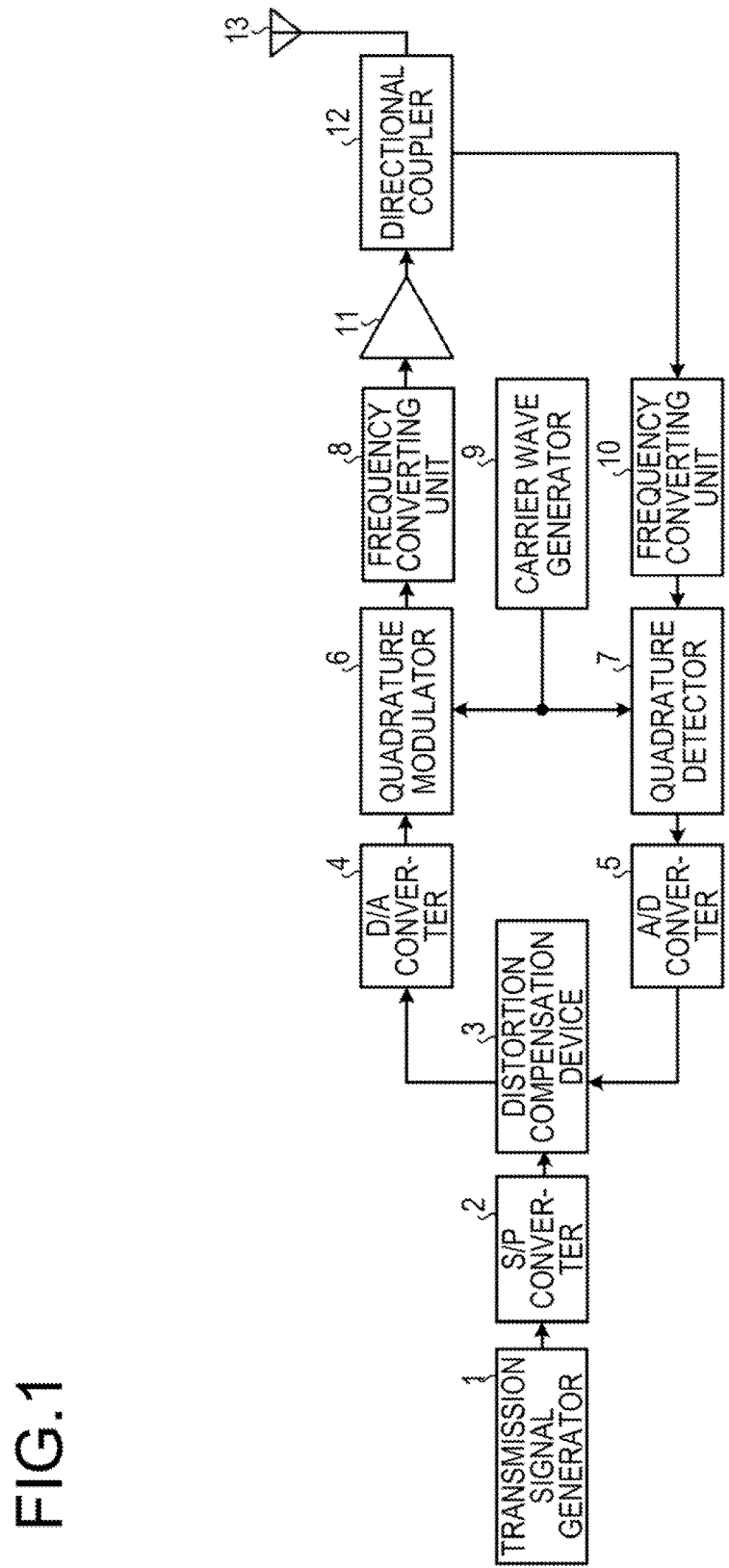
FIG. 1 is a view illustrating a configuration of a transmission device having a distortion compensation device of first embodiment.

FIG. 1 is a view illustrating a configuration of a transmission device having a distortion compensation device of the first embodiment. The transmission device of the first embodiment includes a transmission signal generator 1, a serial to parallel (S/P) converter 2, a distortion compensation device 3, a digital to analog (D/A) converter 4, and an analog to digital (A/D) converter 5. Also, the transmission device related to the present embodiment includes a quadrature modulator 6, a quadrature detector 7, a frequency converting unit 8, a carrier wave generator 9, a frequency converting unit 10, an amplifier 11, a directional coupler 12, and an antenna 13.

The transmission signal generator 1 generates a serial digital data string. Then, the transmission signal generator 1 inputs the generated data string to the S/P converter 2.

The S/P converter 2 receives the serial digital data string from the transmission signal generator 1. Then, the S/P converter 2 alternately distributes the received digital data string one bit by one bit and outputs the distributed data string to the distortion compensation device 3 so as to convert the data into two sequences of an in-phase component signal (I signal: In-Phase component) and a quadrature component signal (Q signal: Quadrature component).

The distortion compensation device 3 receives a transmission signal that is divided into an I signal and a Q signal from the S/P converter 2. The transmission signal that is divided into the I signal and the Q signal is an example of an input signal. Also, the distortion compensation device 3 receives a feedback demodulated signal (a feedback signal) from the A/D converter 5 to be described below. Then, the distortion compensation device 3 calculates a distortion compensation coefficient from a difference between the transmission signal and the feedback demodulated signal. Then, the distortion compensation device 3 stores the calculated distortion compensation coefficient in an LUT by corresponding to a combination of a plurality of addresses.

Also, the distortion compensation device 3 generates two addresses for acquiring a distortion compensation coefficient from the LUT. The distortion compensation device 3 acquires the distortion compensation coefficient corresponding to a combination of the generated two addresses from the LUT. The distortion compensation device 3 performs a predistortion processing on the transmission signal to be input to the amplifier 11 using the acquired distortion compensation coefficient. Then, the distortion compensation device 3 outputs the transmission signal that has been subjected to the predistortion processing to the D/A converter 4. The generation of addresses and distortion compensation by the distortion compensation device 3 will be described below.

The D/A converter 4 receives the transmission signal having the I signal and the Q signal from the distortion compensation device 3. Then, the D/A converter 4 converts each of the received I signal and Q signal into an analogue baseband signal. Then, the D/A converter 4 outputs the baseband signal to the quadrature modulator 6.

The carrier wave generator 9 generates a reference carrier wave. Then, the carrier wave generator 9 outputs the generated carrier wave to the quadrature modulator 6 and the quadrature detector 7.

The quadrature modulator 6 receives the baseband signal from the D/A converter 4. Also, the quadrature modulator 6 receives the reference carrier wave from the carrier wave generator 9. In addition, the quadrature modulator 6 multiplies the I signal in the received baseband signal by the reference carrier wave. Also, the quadrature modulator 6 multiplies the Q signal in the received baseband signal by a carrier wave that has been phase-shifted from the reference carrier wave by 90°. Further, the quadrature modulator 6 adds up the respective multiplication results so as to perform a quadrature modulation. Then, the quadrature modulator 6 outputs a quadrature-modulated signal, which is the baseband signal that has been subjected to the quadrature modulation, to the frequency converting unit 8.

The frequency converting unit 8 receives the quadrature-modulated signal from the quadrature modulator 6. In addition, the frequency converting unit 8 mixes the received quadrature-modulated signal with a local oscillation signal to convert the quadrature-modulated signal into a radio frequency. Further, the frequency converting unit 8 outputs a signal having the radio frequency to the amplifier 11.

The amplifier 11 receives the signal having the radio frequency from the frequency converting unit 8. Then, the amplifier 11 amplifies the power of the received signal. Then, the amplifier 11 outputs the amplified signal to the directional coupler 12.

The directional coupler 12 transmits a part of the signal received from the amplifier 11 through the antenna 13. Also, the directional coupler 12 outputs a part of the signal received from the amplifier 11 to the frequency converting unit 10.

The frequency converting unit 10 receives the same signal as the signal transmitted through the antenna 13 from the directional coupler 12. Then, the frequency converting unit 10 performs a frequency conversion in relation to the received signal using a local oscillation signal. The frequency converting unit 10 outputs the quadrature-modulated signal that has been subjected to the frequency conversion to the quadrature detector 7.

The quadrature detector 7 receives the quadrature-modulated signal that has been subjected to the frequency conversion by the frequency converting unit 10. Then, the quadrature detector 7 performs quadrature detection by multiplying the received quadrature-modulated signal by respective reference carrier waves whose phases are different from each other by 90°. The quadrature detector 7 outputs the I signal and the Q signal obtained through the quadrature detection to the A/D converter 5.

The A/D converter 5 receives the I signal and the Q signal from the quadrature detector 7. Then, the A/D converter 5 converts the received I signal and Q signal into digital signals. Then, the A/D converter 5 outputs the I signal and the Q signal that have been converted into the digital signals, to the distortion compensation device 3.

Figure 2:
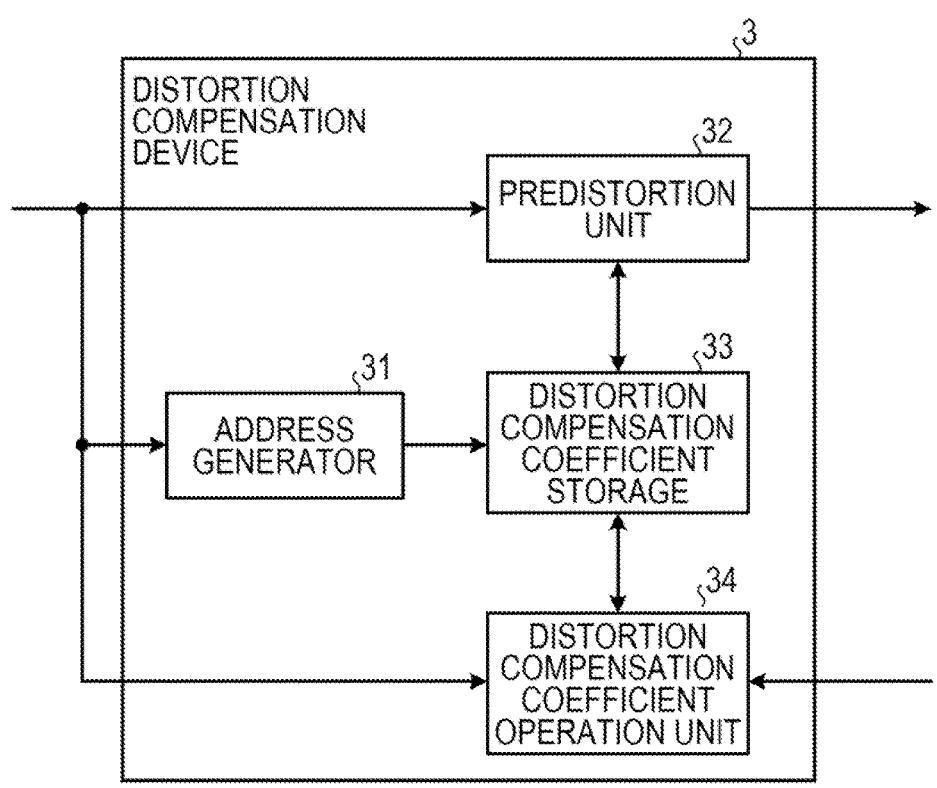
FIG. 2 is a view illustrating an exemplary configuration of the distortion compensation device of first embodiment.

Hereinafter, an exemplary configuration of the distortion compensation device 3 will be described. FIG. 2 is a view illustrating an exemplary configuration of the distortion compensation device of the first embodiment.

As illustrated in FIG. 2, the distortion compensation device 3 includes an address generator 31, a predistortion unit 32, a distortion compensation coefficient storage 33, and a distortion compensation coefficient operation unit 34. Also, the distortion compensation device 3 is implemented by, for example, a digital signal processor (DSP) or the like.

The address generator 31 generates a first address according to a power or an amplitude of the transmission signal input from the S/P converter 2. Also, the address generator 31 generates a second address according to a vector that interconnects sample points of the transmission signal input from the S/P converter 2. The address generator 31 outputs a combination of the first address and the second address as address designation information to the distortion compensation coefficient storage 33.

The distortion compensation coefficient storage 33 stores a look up table (LUT) in which a combination of a plurality of addresses is associated with the distortion compensation coefficient. The distortion compensation coefficient is a coefficient for compensating a distortion occurring in the amplifier 11. The combination of the plurality of addresses includes, for example, a two-dimensional address in which an X-axis direction address and a Y-axis direction address are combined with each other, or a three-dimensional address in which an X-axis direction address, a Y-axis direction address, and a Z-axis direction address are combined with each other.

The distortion compensation coefficient storage 33 receives the address designation information from the address generator 31. Upon receiving a request from the predistortion unit 32, the distortion compensation coefficient storage 33 reads a distortion compensation coefficient corresponding to the combination of the first address and the second address that is designated as the address designation information. The read distortion compensation coefficient is acquired by the predistortion unit 32.

The predistortion unit 32 receives the transmission signal from the S/P converter 2. The predistortion unit 32 makes a request of acquisition of the distortion compensation coefficient on the received transmission signal to the distortion compensation coefficient storage 33. The predistortion unit 32 receives the distortion compensation coefficient on the received transmission signal from the distortion compensation coefficient storage 33. The predistortion unit 32 performs a predistortion processing on the received transmission signal, that is, the transmission signal to be input to the amplifier 11 using the distortion compensation coefficient. The predistortion unit 32 outputs the transmission signal that has been subjected to the predistortion processing to the D/A converter 4.

The distortion compensation coefficient operation unit 34 receives the transmission signal from the S/P converter 2. The distortion compensation coefficient operation unit 34 receives the feedback demodulated signal from the A/D converter 5. The distortion compensation coefficient operation unit 34 compares the transmission signal that has not been subjected to the distortion compensation, to the feedback demodulated signal through an adaptive signal processing using a least mean square (LMS) algorithm, so as to calculate the distortion compensation coefficient so that the difference between the transmission signal and the feedback demodulated signal becomes 0. The distortion compensation coefficient operation unit 34 updates a coefficient stored in the LUT maintained by the distortion compensation coefficient storage 33 using the calculated distortion compensation coefficient.

In this manner, the distortion compensation device 3 adaptively updates the distortion compensation coefficient such that the difference between the feedback demodulated signal that is a part of the signal amplified by the amplifier 11, and the transmission signal that has not been subjected to the distortion compensation, becomes 0.

Figure 3:
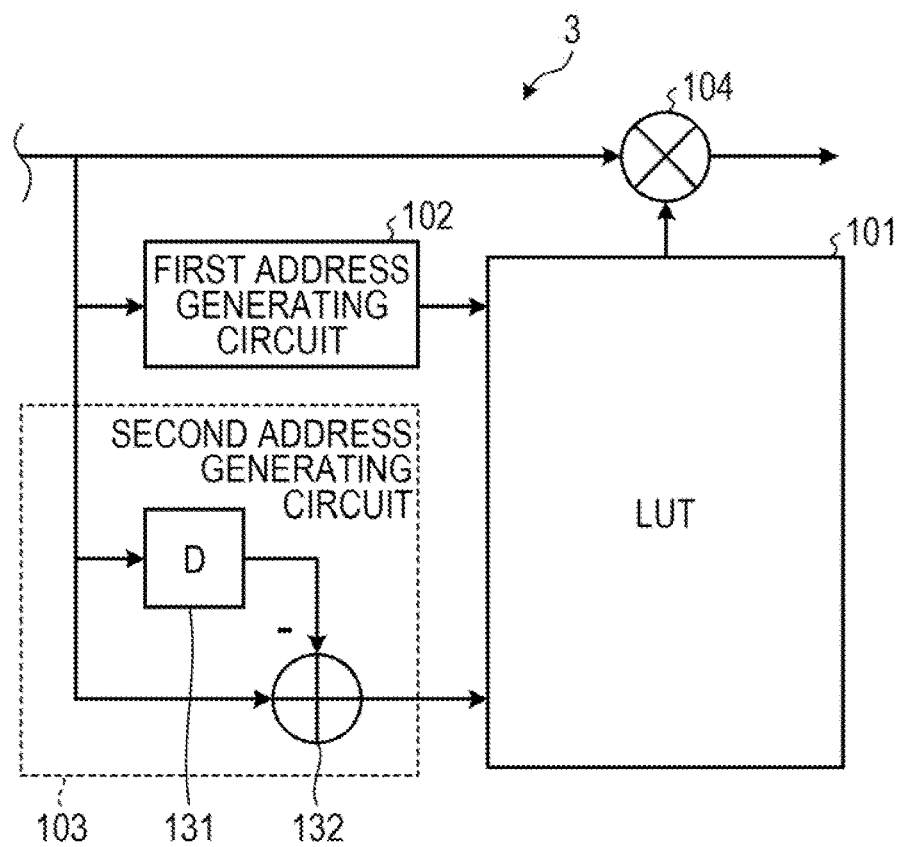
FIG. 3 is a view for explaining details of the configuration of the distortion compensation device of first embodiment.

Hereinafter, the configuration of the distortion compensation device 3 illustrated in FIG. 2 will be described in more detail. FIG. 3 is a view for explaining details of the configuration of the distortion compensation device of the first embodiment. As illustrated in FIG. 3, the distortion compensation device 3 includes an LUT 101, a first address generating circuit 102, a second address generating circuit 103, and a multiplier 104.

The LUT 101 of FIG. 3 corresponds to the distortion compensation coefficient storage 33 of FIG. 2. Also, the first address generating circuit 102 and the second address generating circuit 103 of FIG. 3 correspond to the address generator 31 of FIG. 2. Also, the multiplier 104 of FIG. 3 corresponds to the predistortion unit 32 of FIG. 2.

The LUT 101 stores distortion compensation coefficients for compensating the distortion of the amplifier 11 by corresponding to a combination of a plurality of addresses. The LUT 101 receives the combination of the first address and the second address, as address designation information, from the first address generating circuit 102 and the second address generating circuit 103. Then, the LUT 101 reads a distortion compensation coefficient corresponding to the combination of the first address and the second address, which is designated as the address designation information. The read distortion compensation coefficient is acquired by the multiplier 104.

When the transmission signal is input, the first address generating circuit 102 calculates a power or an amplitude of the transmission signal, and generates the first address that uniquely corresponds to the calculated power or the amplitude of the transmission signal. The first address that uniquely corresponds to the power or the amplitude of the transmission signal is, for example, the X-axis direction address, that is, a one-dimensional direction address. The generated first address is output to the LUT 101. The first address generating circuit 102 is an example of a first generator.

The second address generating circuit 103 calculates a vector that interconnects sample points on the IQ plane where sample points of transmission signals are drawn in time series, and generates a second address uniquely corresponding to the calculated vector. Specifically, the second address generating circuit 103 includes a delay element 131, and a subtractor 132. The second address generating circuit 103 is an example of a second generator.

The delay element 131 delays the transmission signal by one sample point, and outputs a delay signal, which is obtained by delaying the transmission signal by one sample point, to the subtractor 132.

The subtractor 132 subtracts the delay signal input from the delay element 131, from the transmission signal so as to calculate a vector "a" that interconnects a sample point of the transmission signal corresponding to a past time point, and a sample point of the transmission signal corresponding to a present time point on the IQ plane. Hereinafter, the sample point of the transmission signal corresponding to the past time point on the IQ plane is referred to as a "past sample point," and the sample point of the transmission signal corresponding to the present time point on the IQ plane is referred to as a "present sample point." The vector at that interconnects the past sample point and the present sample point and is calculated by the subtractor 132, is represented by the following equation (1).

$$\vec{a} = \vec{a}_0 - \vec{a}_{-1} \qquad (1)$$

Here, $\vec{a}_{-1}$: position vector of past sample point $\vec{a}_0$: position vector of present sample point The subtractor 132 generates the second address uniquely corresponding to the calculated vector "a." The second address uniquely corresponding to the vector "a" only has to be an address that indicates the magnitude and direction of the vector "a," and may be represented by using, for example, polar coordinates. The second address uniquely corresponding to the vector "a" is, for example, a Y-axis direction address which is a two-dimensional direction address. The generated second address is output to the LUT 101.

Figure 4:
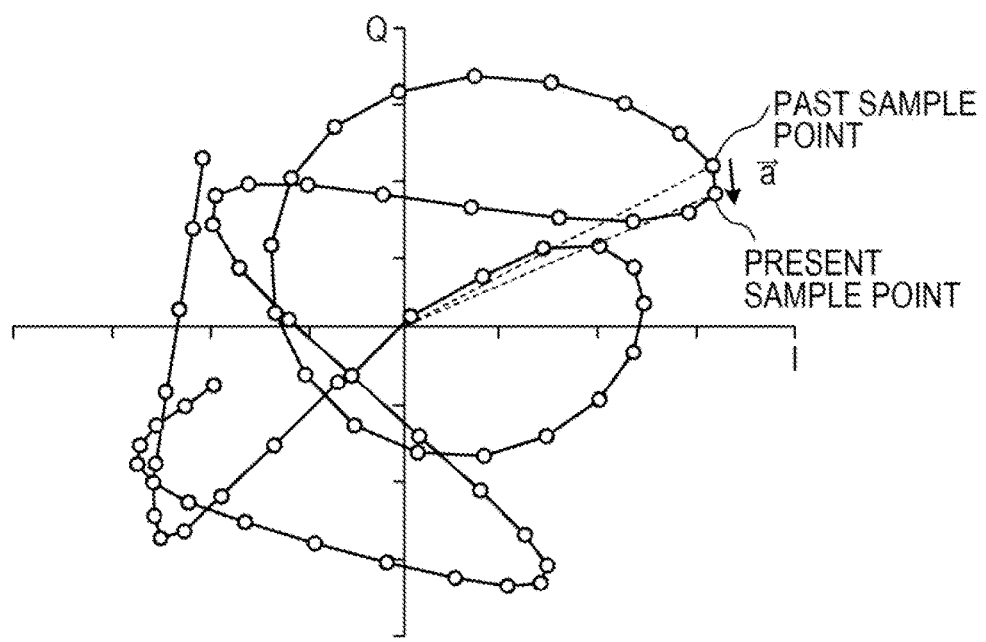
FIG. 4 is a view for explaining a vector "a" that interconnects a past sample point and a present sample point.

FIG. 4 is a view for explaining a vector "a" that interconnects a past sample point and a present sample point. FIG. 4 illustrates an IQ plane where the sample points of input signals which include the past sample point and the present sample point are drawn in time series. In FIG. 4, two broken lines correspond to a phase of a past sample point, and a phase of a present sample point, respectively. Also, an angle between broken lines corresponds to a phase difference between the past sample point and the present sample point.

As illustrated in FIG. 4, when a change amount of phases of input signals is decreased, an angle between two broken lines approaches zero. That is, the phase difference between the past sample point and the present sample point approaches zero. Accordingly, in the technique in which an address according to a phase difference of input signals at different time points is generated, the resolution of an address may be reduced, and an optimum address for reading a distortion compensation coefficient from the LUT may not be designated.

In contrast, the second address generating circuit 103 of the present embodiment generates a second address according to a vector "a" that interconnects a past sample point and a present sample point. As illustrated in FIG. 4, the magnitude and direction of the vector "a" are not lost even when the phase difference between the past sample point and the present sample point approaches zero. Accordingly, even when a change amount of phases of input signals is decreased, the reduction of a resolution of the second address generated according to the vector "a" is suppressed.

The multiplier 104 acquires a distortion compensation coefficient corresponding to a combination of the first address and the second address from the LUT 101. The multiplier 104 performs a predistortion processing on the transmission signal using the acquired distortion compensation coefficient. Specifically, the multiplier 104 multiplies the distortion compensation coefficient by the transmission signal so as to generate a transmission signal that has been subjected to the predistortion processing.

Figure 5:
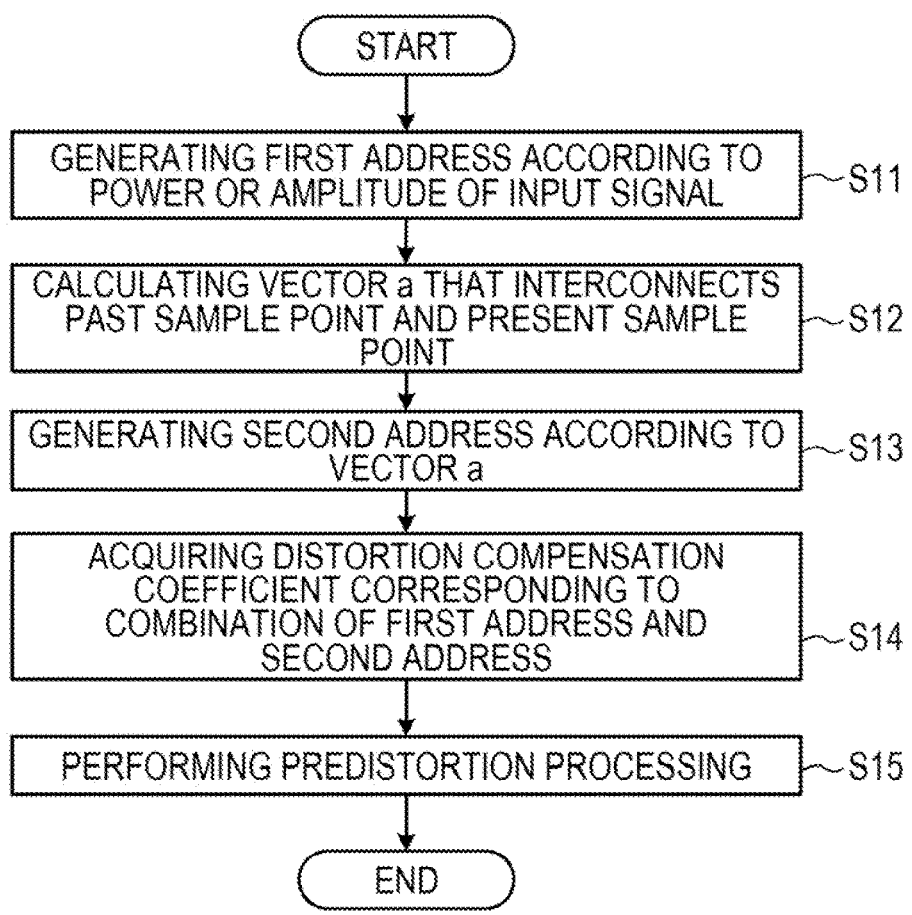
FIG. 5 is a flow chart illustrating an exemplary processing operation of the distortion compensation device of first embodiment.

Hereinafter, descriptions will be made on a processing operation of the distortion compensation device 3 of the first embodiment. FIG. 5 is a flow chart illustrating an exemplary processing operation of the distortion compensation device of the first embodiment.

As illustrated in FIG. 5, when a transmission signal is input, the first address generating circuit 102 calculates a power or an amplitude of the transmission signal, and generates a first address uniquely corresponding to the calculated power or amplitude of the transmission signal (Operation 511).

The subtractor 132 of the second address generating circuit 103 subtracts a delay signal input from the delay element 131, from the transmission signal so as to calculate a vector "a" that interconnects a past sample point and a present sample point on the IQ plane (Operation 512). The subtractor 132 generates a second address uniquely corresponding to the calculated vector "a" (Operation S13).

The multiplier 104 acquires a distortion compensation coefficient corresponding to a combination of the first address and the second address from the LUT 101 (Operation S14), and performs a predistortion processing on the transmission signal using the acquired distortion compensation coefficient (Operation S15).

As described above, the distortion compensation device 3 of the first embodiment generates the second address according to the vector that interconnects sample points of input signals on the IQ plane, in addition to the first address according to the power or amplitude of an input signal. Accordingly, even when the change amount of phases of input signals is decreased, the deterioration of the resolution of the second address is suppressed, and an optimum address for reading a distortion compensation coefficient from the LUT is designated by the combination of the first address and the second address. As a result, even when the change amount of phases of input signals is small, the deterioration of the distortion compensation performance may be improved.

Also, the distortion compensation device 3 of the first embodiment generates a second address according to the vector "a" that interconnects the past sample point and the present sample point on the IQ plane. Accordingly, even when the change amount between the phase of the past input signal and the phase of the present input signal is decreased, the deterioration of the resolution of the second address is suppressed. As a result, even when the change amount between the phase of the past input signal and the phase of the present input signal is decreased, the deterioration of the distortion compensation performance may be improved.

Also, while the first embodiment has disclosed an example in which a delay signal obtained when a transmission signal is delayed by one sample point is subtracted from the transmission signal so as to calculate a vector "a" that interconnects the past sample point and the present sample point on the IQ plane the disclosed technology is not limited thereto. For example, the vector "a" that interconnects the past sample point and the present sample point on the IQ plane, may be calculated by subtracting a delay signal obtained when a transmission signal is delayed by two or more sample points, from the transmission signal.

Second Embodiment

Second embodiment is different from the first embodiment in that a third address is generated according to another vector that interconnects sample points other than sample points interconnected by the vector "a" on the IQ plane. Therefore, hereinafter, descriptions will be made on an example in which a third address is generated according to another vector that interconnects sample points other than sample points interconnected by the vector "a" on the IQ plane.

Figure 6:
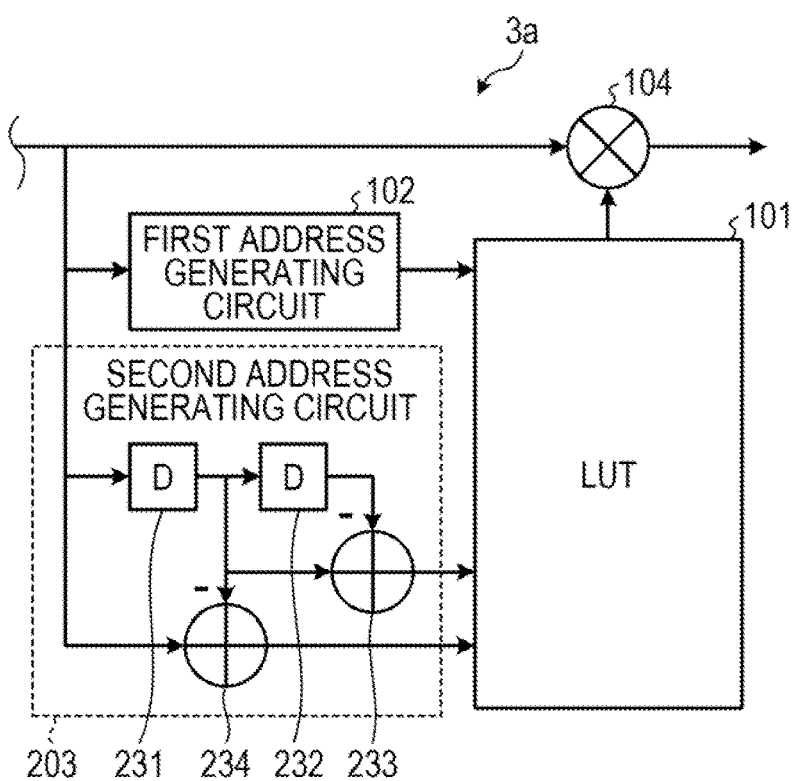
FIG. 6 is a view for explaining details of the configuration of a distortion compensation device of second embodiment.

FIG. 6 is a view for explaining details of the configuration of a distortion compensation device of second embodiment. Also, the configuration of the transmission device of the second embodiment is the same as that of the first embodiment as illustrated in FIG. 1. Also, it is assumed that respective parts having the same reference numerals in the second embodiment as those in the first embodiment have the same functions as those of the first embodiment unless the functions are particularly described.

As illustrated in FIG. 6, the distortion compensation device 3a of the second embodiment includes a second address generating circuit 203 instead of the second address generating circuit 103 illustrated in FIG. 3.

The second address generating circuit 203 generates a second address uniquely corresponding to a vector that interconnects sample points on the IQ plane, and a third address uniquely corresponding to another vector that interconnects other sample points on the IQ plane. Specifically, the second address generating circuit 203 includes a first delay element 231, a second delay element 232, a first subtractor 233, and a second subtractor 234.

The first delay element 231 delays a transmission signal by one sample point, and outputs a first delay signal obtained when the transmission signal is delayed by one sample point to the second delay element 232, the first subtractor 233, and the second subtractor 234.

The second delay element 232 delays the first delay signal input from the first delay element 231 by one sample point, and outputs a second delay signal obtained when the first delay signal is delayed by one sample point to the first subtractor 233.

The first subtractor 233 receives the second delay signal from the second delay element 232. The first subtractor 233 receives the first delay signal from the first delay element 231. The first subtractor 233 subtracts the second delay signal from the first delay signal so as to calculate a vector "a" that interconnects a sample point of the transmission signal corresponding to a past time point and a sample point of the transmission signal corresponding to a present time point on the IQ plane. Hereinafter, the sample point of the transmission signal corresponding to a past time point on the IQ plane is referred to as a "past sample point," and the sample point of the transmission signal corresponding to a present time point on the IQ plane is referred to as a "present sample point." The vector "a," which interconnects the past sample point and the present sample point and is calculated by the first subtractor 233, is represented by the following equation (1). The first subtractor 233 generates the second address uniquely corresponding to the calculated vector "a." The second address uniquely corresponding to the vector "a" only has to be an address that indicates the magnitude and direction of the vector "a," and may be represented by using, for example, polar coordinates. The second address uniquely corresponding to the vector "a" is, for example, a Y-axis direction address which is a two-dimensional direction address. The generated second address is output to the LUT 101.

The second subtractor 234 receives the first delay signal from the first delay element 231. The second subtractor 234 subtracts the first delay signal from the transmission signal so as to calculate a vector "b" that interconnects the present sample point and a sample point corresponding to a future time point on the IQ plane. Hereinafter, the sample point of the transmission signal corresponding to the future time point on the IQ plane is referred to as a "future sample point." The vector "b" that interconnects the present sample point and the future sample point and is calculated by the second subtractor 234, is represented by the following equation (2).

$$\vec{b} = \vec{a}_{+1} - \vec{a}_0 \qquad (2)$$

Here, $\vec{a}_{+1}$: position vector of future sample point
$\vec{a}_0$: position vector of present sample point The second subtractor 234 generates the third address uniquely corresponding to the calculated vector "b." The third address uniquely corresponding to the vector "b" only has to be an address that indicates the magnitude and direction of the vector "b," and may be represented by using, for example, polar coordinates. The third address uniquely corresponding to the vector "b" is, for example, a Z-axis direction address which is a three-dimensional direction address. The generated third address is output to the LUT 101.

Figure 7:
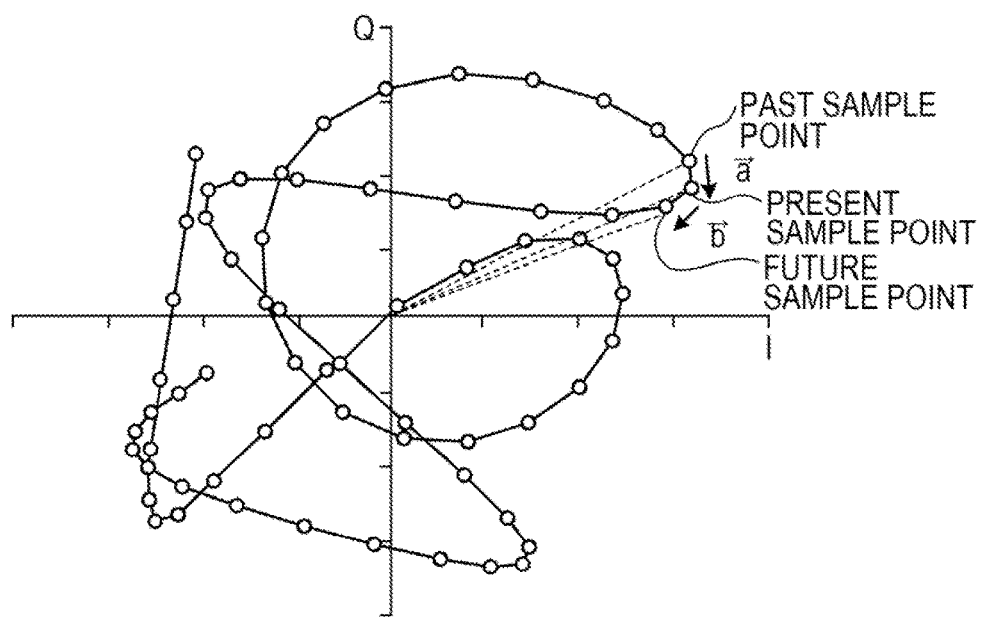
FIG. 7 is a view for explaining a vector "b" that interconnects a present sample point and a future sample point.

FIG. 7 is a view for explaining a vector "b" that interconnects a present sample point and a future sample point. FIG. 7 illustrates an IQ plane on which sample points of input signals which include a past sample point, a present sample point, and a future sample point are drawn in time series. In FIG. 7, three broken lines correspond to a phase of a past sample point, a phase of a present sample point, and a phase of a future sample point, respectively. Also, angles between broken lines correspond to a phase difference between the past sample point and the present sample point, and a phase difference between the present sample point and the future sample point.

As illustrated in FIG. 7, when a change amount of phases of input signals is decreased, an angle between broken lines approaches zero. That is, each of the phase difference between the past sample point and the present sample point, and the phase difference between the present sample point and the future sample point approaches zero. Accordingly, in a technique in which an address according to a phase difference of input signals at different time points is generated, the resolution of the address may be reduced, and an optimum address for reading a distortion compensation coefficient from an LUT may not be designated.

In contrast, the second address generating circuit 203 of the present embodiment generates a second address according to a vector "a" that interconnects a past sample point and a present sample point, and a third address according to a vector "b" that interconnects a present sample point and a future sample point. The magnitude and direction of the vector "a" are not lost as illustrated in FIG. 7, even when the phase difference between the past sample point and the present sample point approaches zero. Also, the magnitude and direction of the vector "b" are not lost as illustrated in FIG. 7, even when the phase difference between the present sample point and the future sample point approaches zero. Accordingly, even when a change amount of phases of input signals is decreased, the deterioration of a resolution of the second address generated according to the vector "a" is suppressed, and also the deterioration of a resolution of the third address generated according to the vector "b" is suppressed.

Also, the LUT 101 of the second embodiment receives a combination of a first address, a second address, and a third address, as address designation information, from the first address generating circuit 102 and the second address generating circuit 203. Then, the LUT 101 reads a distortion compensation coefficient that corresponds to the combination of the first address, the second address, and the third address and is designated as the address designation information. The read distortion compensation coefficient is acquired by the multiplier 104. The multiplier 104 performs a predistortion processing on the transmission signal using the acquired distortion compensation coefficient.

Figure 8:
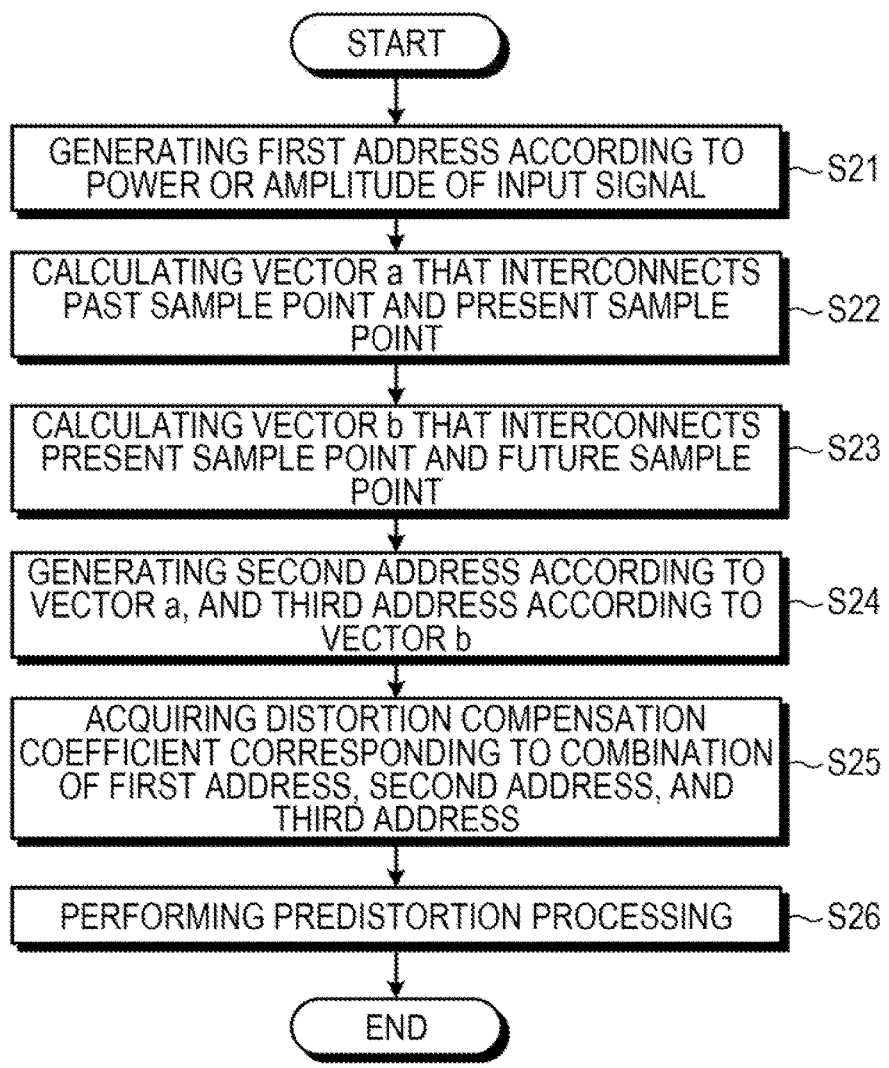
FIG. 8 is a flow chart illustrating an exemplary processing operation of the distortion compensation device of second embodiment.

Hereinafter, descriptions will be made on a processing operation of the distortion compensation device 3a of the second embodiment. FIG. 8 is a flow chart illustrating an exemplary processing operation of the distortion compensation device of the second embodiment.

As illustrated in FIG. 8, when a transmission signal is input, the first address generating circuit 102 calculates a power or an amplitude of the transmission signal, and generates a first address uniquely corresponding to the calculated power or amplitude of the transmission signal (Operation S21).

The first subtractor 233 of the second address generating circuit 203 receives a second delay signal from the second delay element 232. The first subtractor 233 receives a first delay signal from the first delay element 231. The first subtractor 233 subtracts the second delay signal from the first delay signal so as to calculate a vector "a" that interconnects a past sample point and a present sample point on an IQ plane (Operation S22).

The second subtractor 234 receives the first delay signal from the first delay element 231. The second subtractor 234 subtracts the first delay signal from the transmission signal so as to calculate a vector "b" that interconnects a present sample point and a future sample point on the IQ plane (Operation S23). The first subtractor 233 and the second subtractor 234 generate a second address uniquely corresponding to the vector "a," and a third address uniquely corresponding to the vector "b" (Operation S24).

The multiplier 104 acquires a distortion compensation coefficient corresponding to a combination of the first address, the second address, and the third address from the LUT 101 (Operation S25), and performs a predistortion processing on the transmission signal using the acquired distortion compensation coefficient (Operation S26).

As described above, the distortion compensation device 3a of the second embodiment generates a third address according to another vector that interconnects sample points other than sample points interconnected by one vector on the IQ plane, in addition to the first address and the second address. Accordingly, even when the change amount of phases of input signals is decreased, the deterioration of the resolution of each of the second address and the third address is suppressed, and an optimum address of an LUT is designated by the combination of the first address, the second address, and the third address. As a result, even when the change amount of phases of input signals is small, a deterioration of the distortion compensation performance may be further improved.

Also, the distortion compensation device 3a of the second embodiment generates a second address according to a vector "a" that interconnects a past sample point and a present sample point on the IQ plane, and a third address according to a vector "b" that interconnects a present sample point and a future sample point on the IQ plane. Therefore, even when the change amount between the phase of the past input signal and the phase of the present input signal, and the change amount between the phase of the present input signal and the phase of the future input signal are decreased, the deterioration of the resolution of each of the second address and the third address is suppressed. As a result, even when the change amount between the phase of the past input signal and the phase of the present input signal, and the change amount between the phase of the present input signal and the phase of the future input signal are decreased, the deterioration of the distortion compensation performance may be improved.

Third Embodiment

The third embodiment is different from the second embodiment in that a second address is generated according to a cross product of a vector "a" interconnecting a past sample point and a present sample point, and a vector "b" interconnecting a present sample point and a future sample point on an IQ plane. Therefore, hereinafter, descriptions will be made on an example in which a second address is generated according to a cross product of a vector "a" interconnecting a past sample point and a present sample point, and a vector "b" interconnecting a present sample point and a future sample point on an IQ plane.

Figure 9:
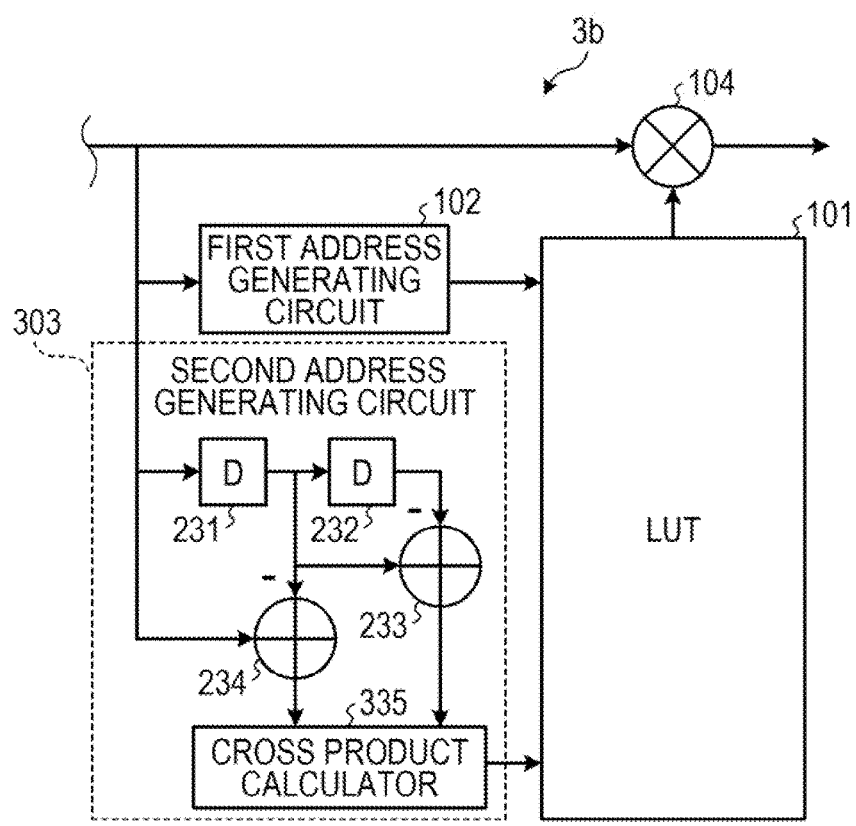
FIG. 9 is a view for explaining details of the configuration of a distortion compensation device of third embodiment.

FIG. 9 is a view for explaining details of the configuration of a distortion compensation device of the third embodiment. Also, the configuration of the transmission device of third embodiment is the same as that of the first embodiment as illustrated in FIG. 1. Also, it is assumed that respective parts having the same reference numerals in the third embodiment as those in the second embodiment have the same functions as those of the second embodiment if they are not particularly described.

As illustrated in FIG. 9, a distortion compensation device 3b of the third embodiment includes a second address generating circuit 303 instead of the second address generating circuit 203 illustrated in FIG. 6.

The second address generating circuit 303 generates a second address according to a cross product of a vector "a" interconnecting a past sample point and a present sample point, and a vector "b" interconnecting a present sample point and a future sample point on an IQ plane. Specifically, the second address generating circuit 303 includes a first delay element 231, a second delay element 232, a first subtractor 233, a second subtractor 234, and a cross product calculator 335.

The first delay element 231 and the second delay element 232 correspond to the first delay element 231 and the second delay element 232, respectively, as illustrated in FIG. 6.

The first subtractor 233 subtracts the second delay signal from the first delay signal in the same manner as the first subtractor 233 illustrated in FIG. 6 so as to calculate the vector "a" that interconnects the past sample point and the present sample point on the IQ plane. The vector "a" calculated by the first subtractor 233 is output to the cross product calculator 335.

The second subtractor 234 subtracts the first delay signal from the transmission signal in the same manner as the second subtractor 234 illustrated in FIG. 6 so as to calculate the vector "b" that interconnects the present sample point and the future sample point on the IQ plane. The vector "b" calculated by the second subtractor 234 is output to the cross product calculator 335.

The cross product calculator 335 calculates a cross product (a×b) of the vector "a" input from the first subtractor 233 and the vector "b" input from the second subtractor 234. The cross product calculator 335 generates a second address uniquely corresponding to the calculated cross product (a×b). The second address uniquely corresponding to the cross product (a×b) is represented by using, for example, a magnitude of the cross product (a×b). The generated second address is output to the LUT 101. When a component of the vector "a" is (x1, y1), a component of the vector "b" is (x2, y2), and an angle formed by the vector "a" and the vector "b" is θ, the magnitude |a×b| of the cross product (a×b) calculated by the cross product calculator 335 is represented by the following equation (3).

$$|\vec{a} \times \vec{b}| = |\vec{a}||\vec{b}| A \sin\theta = x1 \cdot y2 - y1 \cdot x2 \quad (3)$$

Figure 10:
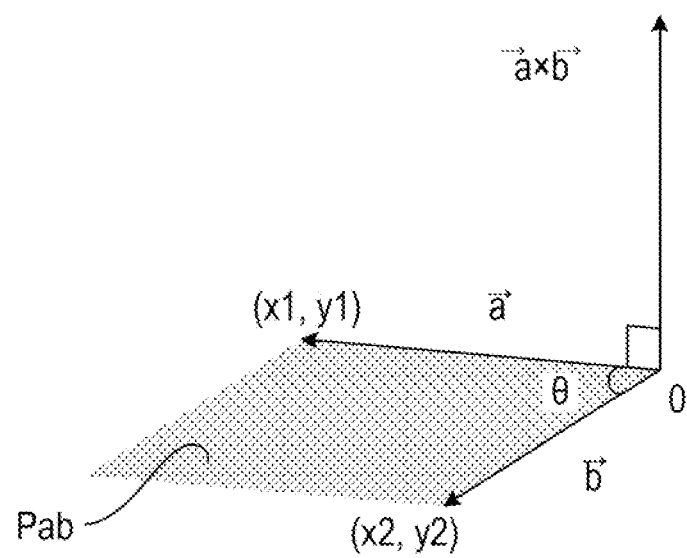
FIG. 10 is a view for explaining the magnitude of a cross product.

FIG. 10 is a view for explaining the magnitude of a cross product. As illustrated in FIG. 10, the magnitude |a×b| of the cross product (a×b) is the same as an area of a parallelogram (Pab) with two sides of the vector "a" and the vector "b," |a||b|sin θ. That is, the magnitude |a×b| of the cross product (a×b) is a scalar quantity determined according to the magnitude of the vector "a," the magnitude of the vector "b," and the angle formed by the vector "a" and the vector "b."

Figure 11:
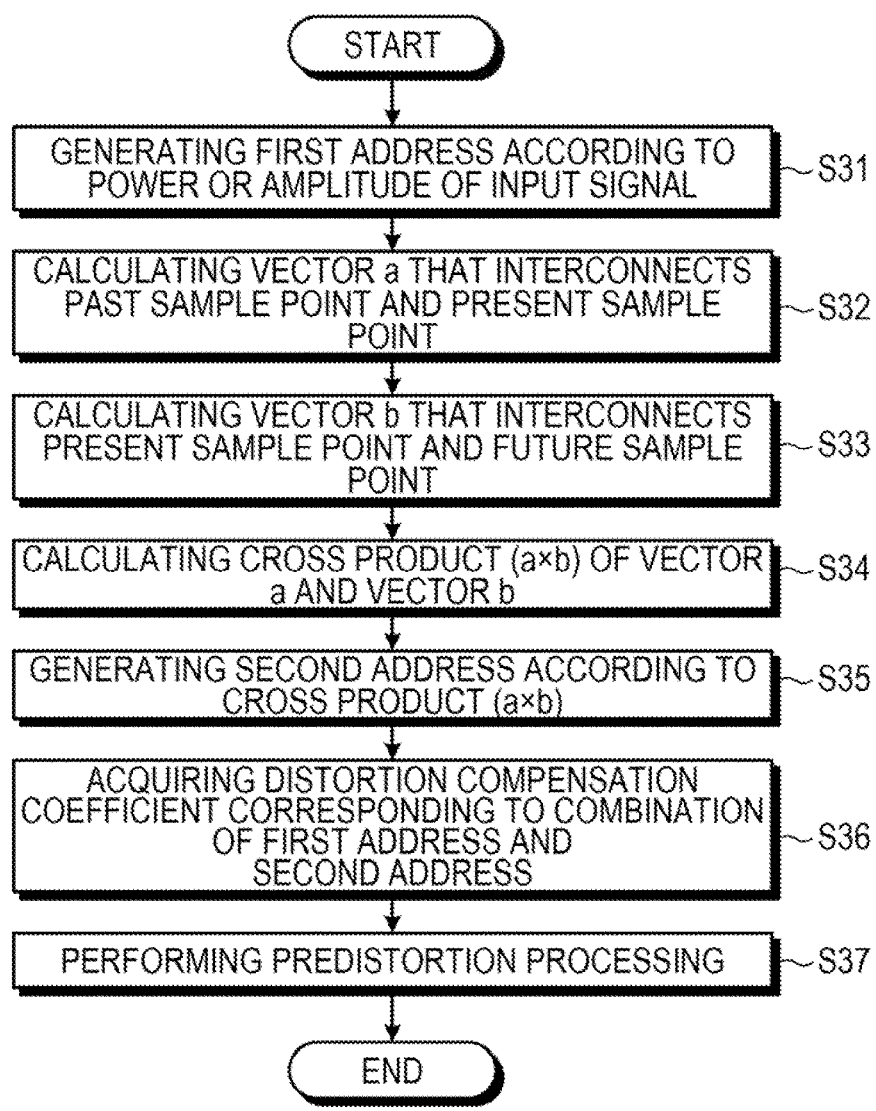
FIG. 11 is a flow chart illustrating an exemplary processing operation of the distortion compensation device of third embodiment.

Hereinafter, descriptions will be made on a processing operation of the distortion compensation device 3b of the third embodiment. FIG. 11 is a flow chart illustrating an exemplary processing operation of the distortion compensation device of the third embodiment.

As illustrated in FIG. 11, when a transmission signal is input, the first address generating circuit 102 calculates a power or an amplitude of the transmission signal, and generates a first address uniquely corresponding to the calculated power or amplitude of the transmission signal (Operation S31).

The first subtractor 233 of the second address generating circuit 303 receives a second delay signal from the second delay element 232. The first subtractor 233 receives a first delay signal from the first delay element 231. The first subtractor 233 subtracts the second delay signal from the first delay signal so as to calculate a vector "a" that interconnects a past sample point and a present sample point on the IQ plane (Operation 532). The vector "a" calculated by the first subtractor 233 is output to the cross product calculator 335.

The second subtractor 234 receives the first delay signal from the first delay element 231. The second subtractor 234 subtracts the first delay signal from the transmission signal so as to calculate a vector "b" that interconnects a present sample point and a future sample point on the IQ plane (Operation 533). The vector "b" calculated by the second subtractor 234 is output to the cross product calculator 335.

The cross product calculator 335 calculates a cross product (a×b) of the vector "a" and the vector "b" (Operation S34). The cross product calculator 335 generates a second address uniquely corresponding to the cross product (a×b) (Operation 535). For example, the cross product calculator 335 generates a magnitude |a×b| of the cross product (a×b), as the second address.

The multiplier 104 acquires a distortion compensation coefficient corresponding to a combination of the first address and the second address from the LUT 101 (Operation S36), and performs a predistortion processing on the transmission signal using the acquired distortion compensation coefficient (Operation 537).

As described above, the distortion compensation device 3b of the third embodiment generates, on an IQ plane, a second address according to a cross product of a vector "a" that interconnects a past sample point and a present sample point, and a vector "b" that interconnects a present sample point and a future sample point. Even when the change amount between the phase of the past input signal and the phase of the present input signal, and the change amount between the phase of the present input signal and the phase of the future input signal are decreased, the deterioration of the resolution of the second address is suppressed. As a result, even when the change amount between the phase of the past input signal and the phase of the present input signal, and the change amount between the phase of the present input signal and the phase of the future input signal are decreased, a deterioration of the distortion compensation performance may be improved. Also, since the optimum address for reading the distortion compensation coefficient from the LUT is designated by a combination of the first address and the second address, an increase of the number of addresses to be read from the LUT may be suppressed.

Fourth Embodiment

The fourth embodiment is different from the first embodiment in that a second address is generated according to an average value of vectors "a" that interconnect a past sample point and a present sample point on the IQ plane. Therefore, hereinafter, descriptions will be made on an example in which a second address is generated according to an average value of vectors "a" that interconnect a past sample point and a present sample point on the IQ plane.

Figure 12:
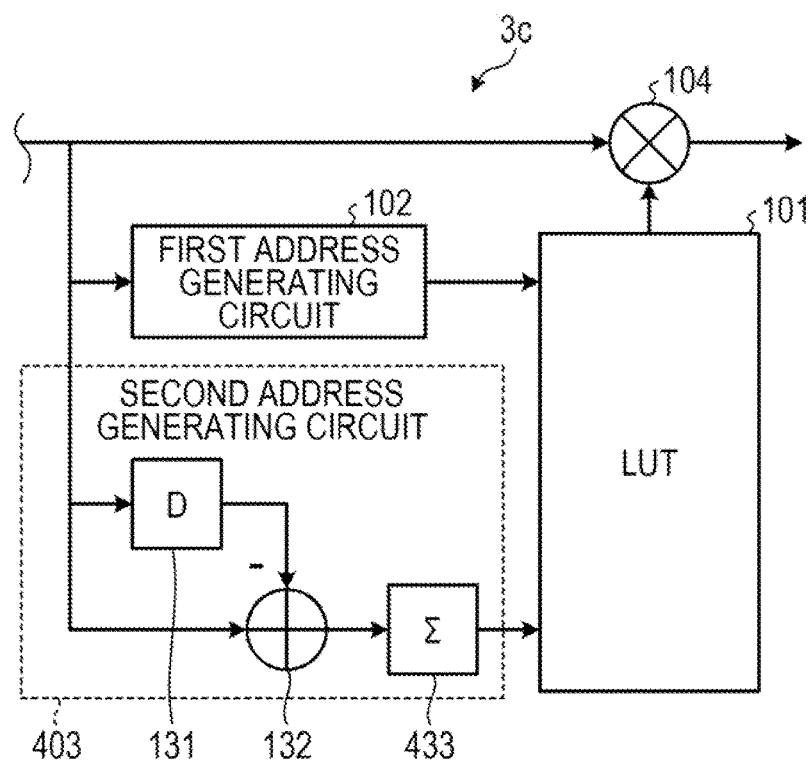
FIG. 12 is a view for explaining details of the configuration of a distortion compensation device of fourth embodiment.

FIG. 12 is a view for explaining details of the configuration of a distortion compensation device of the fourth embodiment. Also, the configuration of the transmission device of the fourth embodiment is the same as that of the first embodiment as illustrated in FIG. 1. Also, it is assumed that respective parts having the same reference numerals in the fourth embodiment as those in the first embodiment have the same functions as those of the first embodiment if they are not particularly described.

As illustrated in FIG. 12, a distortion compensation device 3c of the fourth embodiment includes a second address generating circuit 403 instead of the second address generating circuit 103 illustrated in FIG. 3.

The second address generating circuit 403 generates a second address according to an average value of vectors "a" that interconnect past sample points and present sample points on an IQ plane. Specifically, the second address generating circuit 403 includes a delay element 131, a subtractor 132, and an average value calculator 433.

The delay element 131 corresponds to the delay element 131 illustrated in FIG. 3.

The subtractor 132 subtracts a delay signal input from the delay element 131 from a transmission signal in the same manner as the subtractor 132 illustrated in FIG. 3 so as to calculate the vector "a" that interconnects the past sample point and the present sample point on the IQ plane. The vector "a" calculated by the subtractor 132 is output to the average value calculator 433.

The average value calculator 433 calculates an average value of vectors "a" input from the subtractor 132. The average value includes, for example, a simple moving average value, a weighted moving average or the like. The average value calculator 433 generates a second address uniquely corresponding to the calculated average value of vectors "a." The second address uniquely corresponding to the average value of vectors "a" only has to be an address that indicates the average value having the magnitude and direction of vectors "a", and may be represented by using, for example, polar coordinates. The second address uniquely corresponding to the average value of vectors "a" is, for example, a Y-axis direction address which is a two-dimensional direction address. The generated second address is output to the LUT 101.

Figure 13:
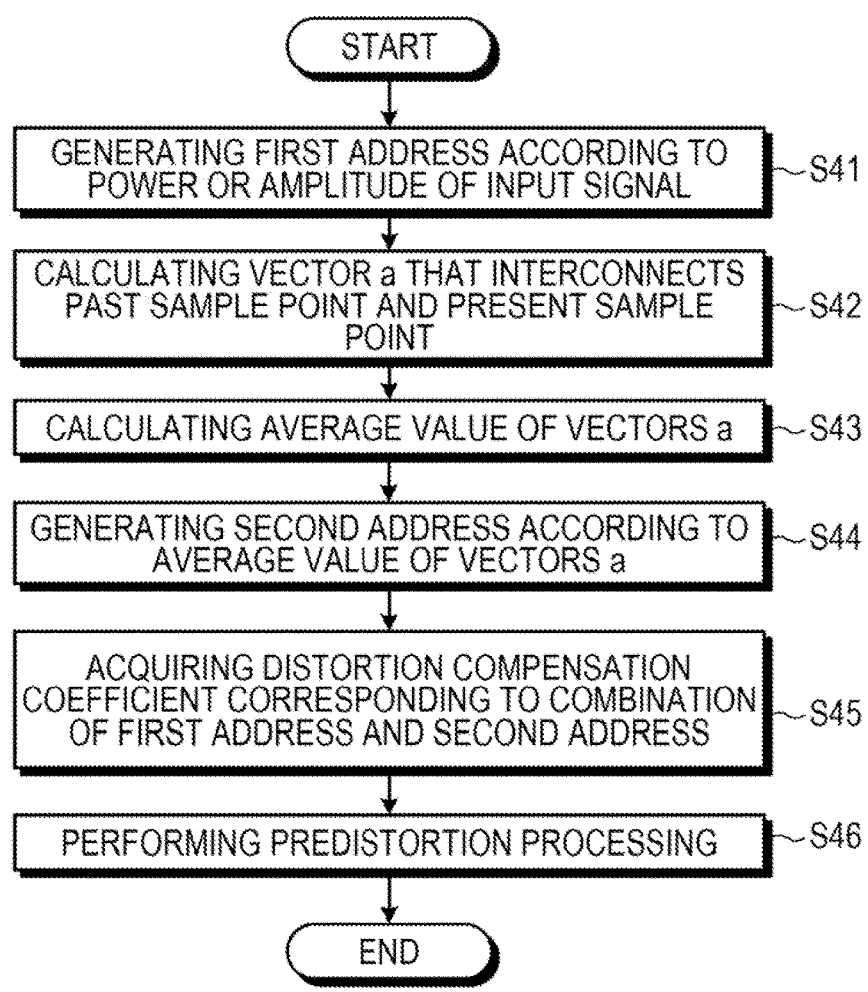
FIG. 13 is a flow chart illustrating an exemplary processing operation of the distortion compensation device of fourth embodiment.

Hereinafter, descriptions will be made on a processing operation of the distortion compensation device 3c of the fourth embodiment. FIG. 13 is a flow chart illustrating an exemplary processing operation of the distortion compensation device of the fourth embodiment, As illustrated in FIG. 13, when a transmission signal is input, the first address generating circuit 102 calculates a power or an amplitude of the transmission signal, and generates a first address uniquely corresponding to the calculated power or amplitude of the transmission signal (Operation S41).

The subtractor 132 of the second address generating circuit 103 subtracts a delay signal input from the delay element 131, from the transmission signal so as to calculate a vector "a" that interconnects a past sample point and a present sample point on the IQ plane (Operation 542).

The average value calculator 433 calculates an average value of vectors "a" (Operation 543). The average value calculator 433 generates a second address uniquely corresponding to the calculated average value of vectors a (Operation 544).

The multiplier 104 acquires a distortion compensation coefficient corresponding to a combination of the first address and the second address from the LUT 101 (Operation 545), and performs a predistortion processing on the transmission signal using the acquired distortion compensation coefficient (Operation 546).

As described above, the distortion compensation device 3c of the fourth embodiment generates the second address according to the average value of vectors "a" that interconnect the past sample points and the present sample points on the IQ plane. Accordingly, even when the change amount between the phase of the past input signal and the phase of the present input signal is decreased, a fluctuation of the second address is smoothed, and the deterioration of the resolution of the second address is further suppressed. As a result, even when the change amount between the phase of the past input signal and the phase of the present input signal is decreased, a deterioration of the distortion compensation performance may be further improved.

Fifth Embodiment

So far, embodiments of the distortion compensation device and the distortion compensation method according to the present disclosure have been described, but the distortion compensation device and the distortion compensation method may be implemented in various different embodiments other than the embodiments described above. Therefore, hereinafter, a modified example of an embodiment, as the fifth embodiment, will be described.

In the second embodiment described above, an example in which the second address generating circuit 203 generates a second address according to a vector "a," and a third address according to a vector "b" has been described, but the disclosed technology is not limited thereto. For example, the second address generating circuit 203 may include an average value calculator configured to calculate an average value of vectors "a", and an average value of vectors "b", and may generate a second address according to the average value of vectors "a", and a third address according to the average value of vectors "b."

Also, in the third embodiment described above, an example in which the second address generating circuit 303 generates a second address according to a cross product of a vector "a" and a vector "b" has been described, but the disclosed technology is not limited thereto. For example, the second address generating circuit 303 may include an average value calculator configured to calculate an average value of cross products of vectors "a" and vectors "b", and may generate a second address according to the average value of the cross products of vectors "a" and vectors "b."

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that the various changes, substitutions, and alterations could be made hereto without departing from the spirit and scope of the invention.

What is claimed is:

1. A distortion compensation device comprising:
   a storage configured to store a distortion compensation coefficient for compensating a distortion of a transmission signal to be amplified and transmitted, by corresponding to a combination of a plurality of addresses;
   a first generator configured to generate a first address according to a power or an amplitude of an input signal;
   a second generator configured to generate a second address according to a first vector to interconnect sample points on an in-phase and quadrature (I-Q) plane where each of the sample points of the input signal is drawn in time series in the I-Q plane corresponding to a different time point; and
   a distortion compensator including a predistortion circuit configured to acquire the distortion compensation coefficient corresponding to the combination of the first address and the second address from the storage, and to perform a predistortion processing on the input signal, by using the acquired distortion compensation coefficient, so as to generate the transmission signal.

2. The distortion compensation device according to claim 1, wherein the second generator includes:
   a delay circuit configured to delay the input signal so as to generate a delay signal; and
   a subtractor configured to subtract the delay signal from the input signal so as to calculate the first vector to interconnect a sample point corresponding to a past time point and a sample point corresponding to a present time point on the I-Q plane, and
   wherein the second generator generates the second address according to the first vector calculated by the subtractor.

3. The distortion compensation device according to claim 2, wherein the second generator further includes: an average value calculator configured to calculate an average value of first vectors calculated by the subtractor, and wherein the second generator generates the second address according to the average value of the first vectors calculated by the average value calculator.

4. The distortion compensation device according to claim 1, wherein the second generator generates a third address according to a second vector to interconnect sample points different from the sample points interconnected by the first vector, and wherein the distortion compensator acquires the distortion compensation coefficient corresponding to the combination of the first address, the second address, and the third address from the storage, and performs the predistortion processing on the input signal by using the acquired distortion compensation coefficient.

5. The distortion compensation device according to claim 4, wherein the second generator includes:
   a first delay circuit configured to delay the input signal so as to generate a first delay signal;
   a second delay circuit configured to delay the first delay signal so as to generate a second delay signal;
   a first subtractor configured to subtract the second delay signal from the first delay signal so as to calculate a third vector to interconnect a sample point corresponding to a past time point and a sample point corresponding to a present time point on the I-Q plane; and
   a second subtractor configured to subtract the first delay signal from the input signal so as to calculate a fourth vector to interconnect a sample point corresponding to the present time point and a sample point corresponding to a future time point on the I-Q plane,
   wherein the second generator generates the second address according to the third vector and the third address according to the fourth vector.

6. The distortion compensation device according to claim 5, wherein the second generator further includes: an average value calculator configured to calculate an average value of third vectors calculated by the first subtractor, and to calculate an average value of fourth vectors calculated by the second subtractor, and wherein the second generator generates the second address according to the average value of third vectors calculated by the average value calculator, and the third address according to the average value of fourth vectors calculated by the average value calculator.

7. The distortion compensation device according to claim 1, wherein the second generator generates the second address according to a cross product of the first vector and a second vector to interconnect sample points different from the sample points interconnected by the first vector.

8. The distortion compensation device according to claim 7, wherein the second generator includes:
   a first delay circuit configured to delay the input signal so as to generate a first delay signal;
   a second delay circuit configured to delay the first delay signal so as to generate a second delay signal;
   a first subtractor configured to subtract the second delay signal from the first delay signal so as to calculate a third vector to interconnect a sample point corresponding to a past time point and a sample point corresponding to a present time point on the I-Q plane;
   a second subtractor configured to subtract the first delay signal from the input signal so as to calculate a fourth vector to interconnect the sample point corresponding to the present time point and a sample point corresponding to a future time point on the I-Q plane; and
   a cross product calculator configured to calculate the cross product of the third vector and the fourth vector, and wherein the second generator generates the second address ding to the cross product calculated by the cross product calculator.

9. The distortion compensation device according to claim 8, wherein the second generator further includes: an average value calculator configured to calculate an average value of the cross products calculated by the cross product calculator, and wherein the second generator generates the second address according to the average value of cross products calculated by the average value calculator.

10. A distortion compensation method, comprising:
   generating a first address according to a power or an amplitude of an input signal;
   generating a second address according to a vector to interconnect sample points on an I-Q (in-phase and quadrature) plane where each of the sample points of the input signal is drawn in time series in the I-Q plane corresponding to a different time point;
   acquiring a distortion compensation coefficient corresponding to a combination of the first address and the second address from a storage configured to store the distortion compensation coefficient for compensating a distortion of a transmission signal to be amplified and transmitted, by corresponding to the combination of a plurality of addresses; and
performing a predistortion processing on the input signal, by using the acquired distortion compensation coefficient, so as to generate the transmission signal.

* * * * *